(12) United States Patent
Lin et al.

(10) Patent No.: US 10,109,613 B2
(45) Date of Patent: Oct. 23, 2018

(54) 3DIC STACKING DEVICE AND METHOD OF MANUFACTURE

(71) Applicant: Taiwan Semiconductor Manufacturing Company, Ltd., Hsin-Chu (TW)

(72) Inventors: Jing-Cheng Lin, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/262,788

(22) Filed: Sep. 12, 2016

(65) Prior Publication Data
US 2017/0005073 A1    Jan. 5, 2017

Related U.S. Application Data

(62) Division of application No. 13/619,877, filed on Sep. 14, 2012, now Pat. No. 9,443,783.
(Continued)

(51) Int. Cl.
*H01L 23/48* (2006.01)
*H01L 23/52* (2006.01)
(Continued)

(52) U.S. Cl.
CPC ........ *H01L 25/0652* (2013.01); *H01L 21/561* (2013.01); *H01L 21/563* (2013.01); *H01L 21/76898* (2013.01); *H01L 23/3171* (2013.01); *H01L 23/49816* (2013.01); *H01L 23/5389* (2013.01); *H01L 24/05* (2013.01); *H01L 24/13* (2013.01); *H01L 24/14* (2013.01); *H01L 24/92* (2013.01); *H01L 24/96* (2013.01); *H01L 25/03* (2013.01); *H01L 25/0657* (2013.01); *H01L 25/50* (2013.01); *H01L 21/568* (2013.01); *H01L 23/3135* (2013.01); *H01L 24/03* (2013.01); *H01L 24/11* (2013.01); *H01L 24/81* (2013.01); *H01L 2224/02372* (2013.01); *H01L 2224/02379* (2013.01); *H01L 2224/0401* (2013.01); *H01L 2224/04105* (2013.01);
(Continued)

(58) Field of Classification Search
CPC ............ H01L 2224/96; H01L 2224/11; H01L 21/561; H01L 21/563; H01L 21/568
See application file for complete search history.

(56) References Cited

U.S. PATENT DOCUMENTS 6,239,496 B1    5/2001 Asada
6,448,661 B1    9/2002 Kim et al.
(Continued)

FOREIGN PATENT DOCUMENTS

| KR | 1020020009605 | 2/2002 |
|---|---|---|
| KR | 20110078399 A | 7/2011 |
| WO | 0067314 A1 | 11/2000 |

*Primary Examiner* — Ismail Muse
(74) *Attorney, Agent, or Firm* — Slater Matsil, LLP

(57) ABSTRACT

A system and method for stacking semiconductor devices in three dimensions is provided. In an embodiment two or more semiconductor dies are attached to a carrier and encapsulated. Connections of the two or more semiconductor dies are exposed, and the two or more semiconductor dies may be thinned to form connections on an opposite side. Additional semiconductor dies may then be placed in either an offset or overhanging position.

20 Claims, 12 Drawing Sheets

Related U.S. Application Data

(60) Provisional application No. 61/665,123, filed on Jun. 27, 2012.

(51) Int. Cl.
- *H01L 29/40* (2006.01)
- *H01L 25/065* (2006.01)
- *H01L 23/498* (2006.01)
- *H01L 23/538* (2006.01)
- *H01L 23/31* (2006.01)
- *H01L 21/56* (2006.01)
- *H01L 25/03* (2006.01)
- *H01L 25/00* (2006.01)
- *H01L 21/768* (2006.01)
- *H01L 23/00* (2006.01)

(52) U.S. Cl.
CPC ............... *H01L 2224/05569* (2013.01); *H01L 2224/05571* (2013.01); *H01L 2224/05572* (2013.01); *H01L 2224/05655* (2013.01); *H01L 2224/05666* (2013.01); *H01L 2224/11002* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11849* (2013.01); *H01L 2224/12105* (2013.01); *H01L 2224/131* (2013.01); *H01L 2224/13023* (2013.01); *H01L 2224/13024* (2013.01); *H01L 2224/13082* (2013.01); *H01L 2224/13147* (2013.01); *H01L 2224/14134* (2013.01); *H01L 2224/14144* (2013.01); *H01L 2224/14154* (2013.01); *H01L 2224/14164* (2013.01); *H01L 2224/14181* (2013.01); *H01L 2224/17181* (2013.01); *H01L 2224/2919* (2013.01); *H01L 2224/73204* (2013.01); *H01L 2224/81005* (2013.01); *H01L 2224/81191* (2013.01); *H01L 2224/81815* (2013.01); *H01L 2224/81895* (2013.01); *H01L 2224/83104* (2013.01); *H01L 2224/9202* (2013.01); *H01L 2224/96* (2013.01); *H01L 2224/97* (2013.01); *H01L 2225/06513* (2013.01); *H01L 2225/06517* (2013.01); *H01L 2225/06524* (2013.01); *H01L 2225/06527* (2013.01); *H01L 2225/06541* (2013.01); *H01L 2225/06562* (2013.01); *H01L 2225/06568* (2013.01); *H01L 2924/15787* (2013.01); *H01L 2924/181* (2013.01); *H01L 2924/18162* (2013.01); *H01L 2924/351* (2013.01)

(56) References Cited

U.S. PATENT DOCUMENTS

| | | | |
|---|---|---|---|
| 2006/0252233 A1 | 11/2006 | Honma et al. | |
| 2007/0023887 A1* | 2/2007 | Matsui | H01L 24/73 257/686 |
| 2007/0090534 A1* | 4/2007 | Iwasaki | H01L 23/5385 257/777 |
| 2008/0054417 A1* | 3/2008 | Lee | H01L 23/4334 257/666 |
| 2008/0133809 A1* | 6/2008 | Saito | G06F 13/1647 710/106 |
| 2009/0309212 A1 | 12/2009 | Shim et al. | |
| 2010/0225002 A1* | 9/2010 | Law | H01L 21/76898 257/774 |
| 2010/0258931 A1* | 10/2010 | Yoshida | H01L 24/97 257/686 |
| 2011/0147945 A1* | 6/2011 | Yoshida | H01L 21/561 257/774 |
| 2011/0156233 A1 | 6/2011 | Kim | |
| 2011/0159639 A1 | 6/2011 | Yee et al. | |
| 2011/0164460 A1* | 7/2011 | Kajigaya | G11C 5/02 365/189.05 |
| 2011/0266693 A1 | 11/2011 | Simmons-Matthews | |
| 2012/0074587 A1 | 3/2012 | Koo et al. | |
| 2012/0077314 A1* | 3/2012 | Park | H01L 25/0657 438/109 |
| 2012/0146242 A1* | 6/2012 | Fujishima | H01L 21/561 257/777 |
| 2012/0175767 A1* | 7/2012 | Hung | H01L 25/0657 257/737 |
| 2012/0193779 A1* | 8/2012 | Lee | H01L 23/3128 257/737 |
| 2012/0211886 A1 | 8/2012 | Lieu et al. | |
| 2013/0037802 A1* | 2/2013 | England | H01L 21/568 257/48 |
| 2013/0062760 A1 | 3/2013 | Hung et al. | |
| 2013/0082383 A1 | 4/2013 | Aoya | |
| 2013/0161824 A1* | 6/2013 | Choi | H01L 21/76898 257/774 |
| 2013/0175700 A1 | 7/2013 | Chen et al. | |
| 2013/0187292 A1* | 7/2013 | Semmelmeyer | H01L 25/0652 257/777 |

\* cited by examiner

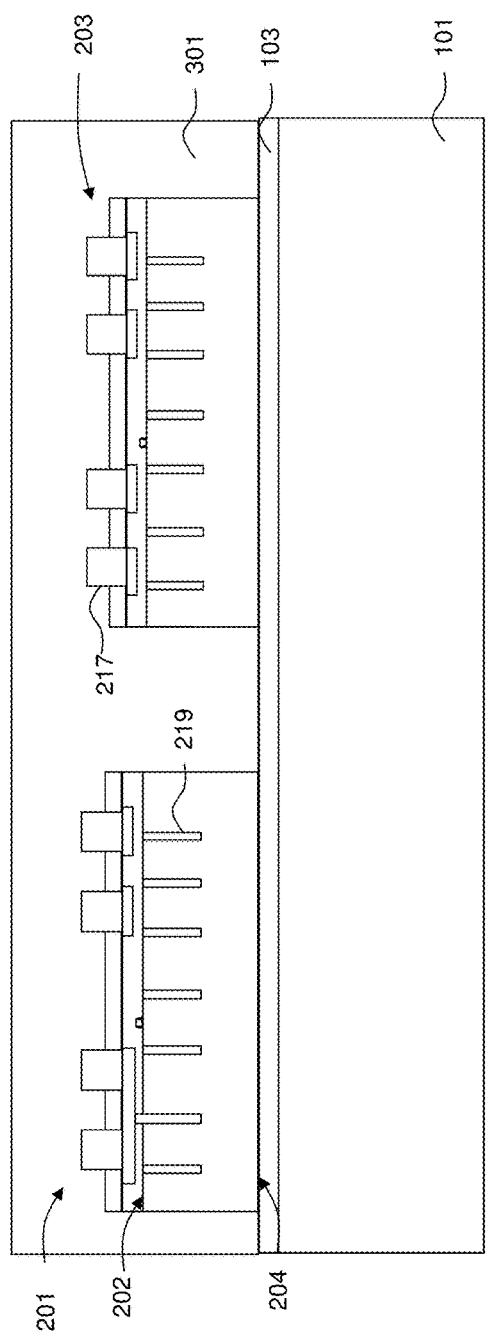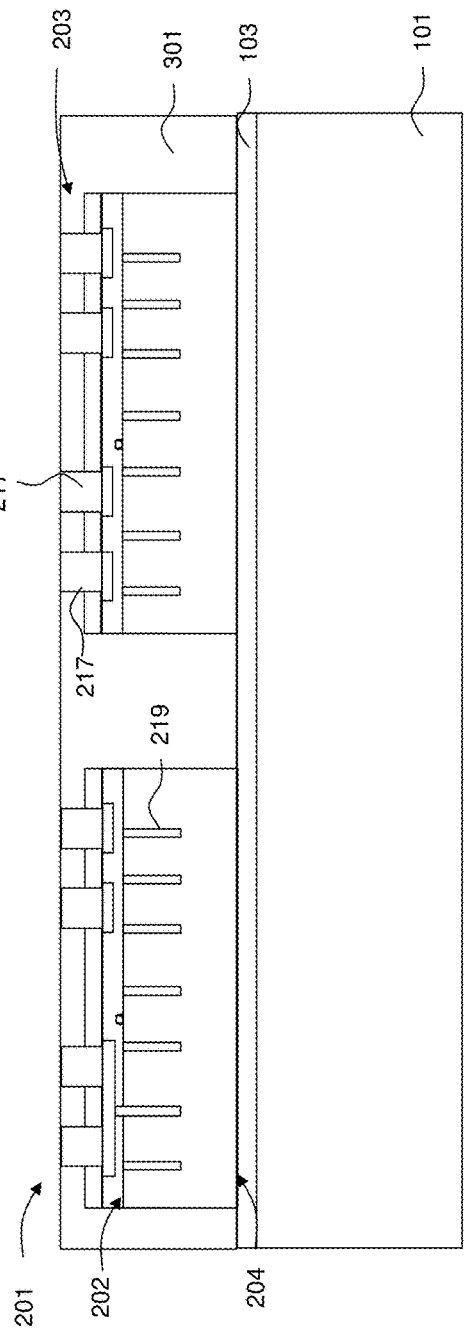

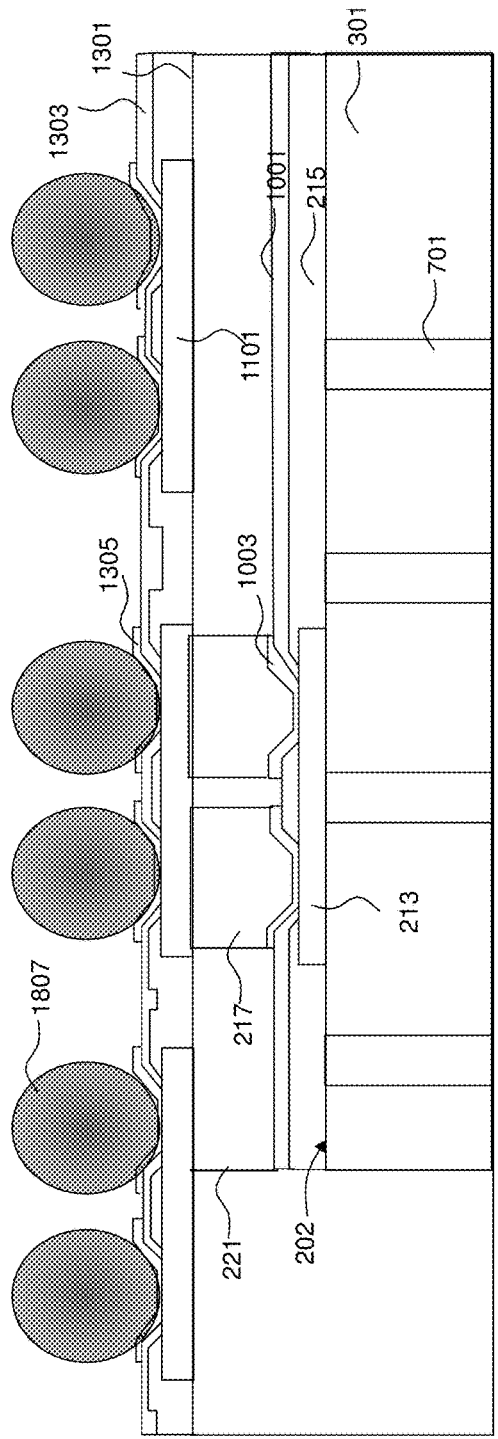
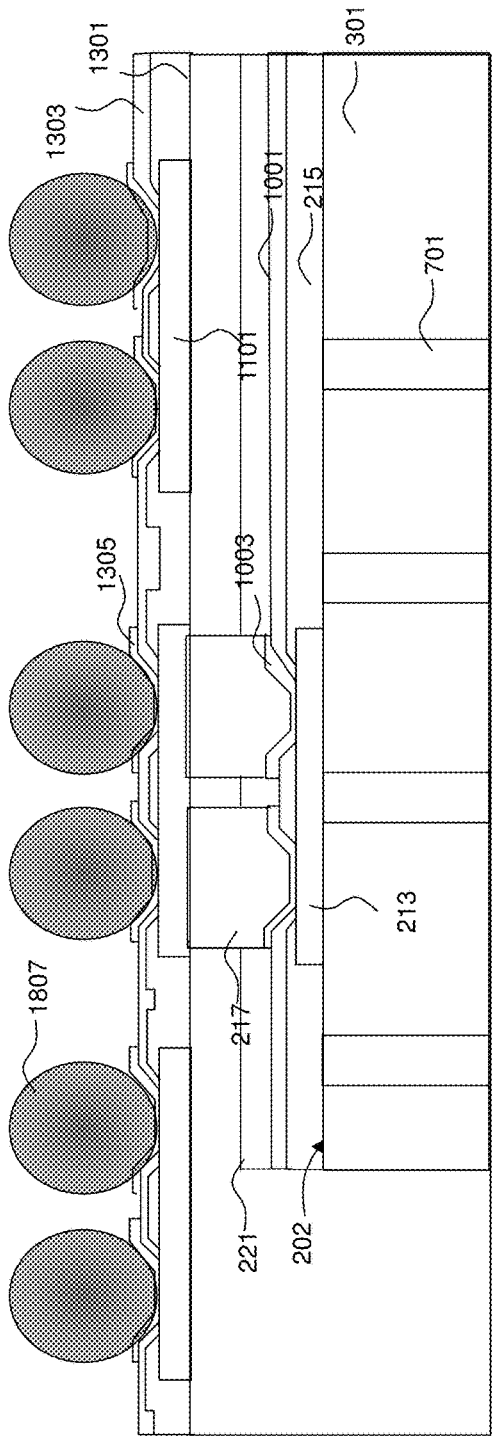
Figure 13C
Figure 13D

3DIC STACKING DEVICE AND METHOD OF MANUFACTURE

This application is a division of U.S. patent application Ser. No. 13/619,877, entitled "3DIC Stacking Device and Method of Manufacture," filed on Sep. 14, 2012 which application claims the benefit of U.S. Provisional Application No. 61/665,123, entitled "3DIC Stacking Device and Method of Manufacture," filed on Jun. 27, 2012, which applications are incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1 through 10D illustrate a manufacturing process to connect semiconductor devices in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Before addressing the illustrative embodiments in detail, aspects of the embodiments and advantageous features thereof will be addressed general. As will be illustrated below, embodiments disclosed herein provide for a method and structure that improve issues related to top die overhang issues. For example, a chip on (chip on substrate) (Co(CoS)) may experience low yields and relatively high costs. (Chip on wafer) on substrate ((CoW)oS) techniques are not practical for an overhanging top die. A (chip on chip) on substrate ((CoC)oS) experiences higher costs than Co(CoS) and lower yields than (CoW)oS.

In general terms, the illustrated embodiments provide a CoW process that allows top die overhangs or top dies larger than a bottom die (w/TV die). Embodiments may also provide a solution for CoWoS process and potentially skip substrate to gain lower assembly cost. Embodiments may further exhibit a lower form factor by utilizing BGA techniques.

Figure 1:
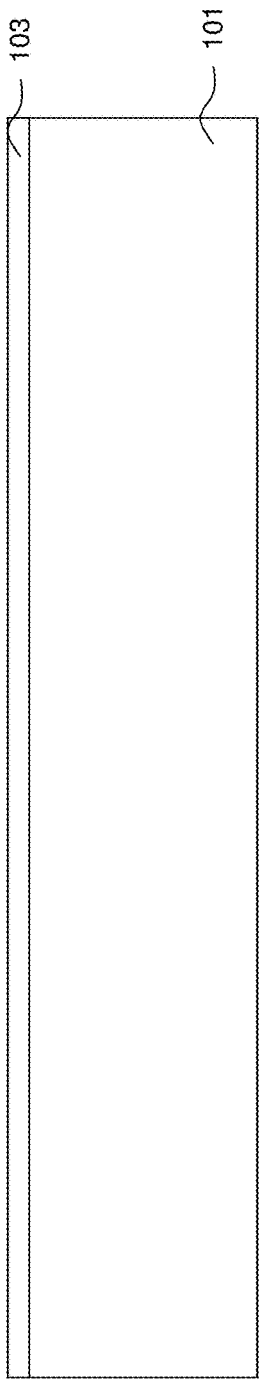

Turning now to FIGS. 1-10B, a first embodiment is provided. FIG. 1 illustrates a first carrier wafer 101 having a first adhesive 103 applied thereto. The first carrier wafer 101 may comprise, for example, glass, silicon oxide, aluminum oxide, and the like, and may have a thickness greater than about 12 mils. Alternatively, the first carrier wafer 101 may comprise a suitable carrier tape. If a carrier tape is utilized, the carrier tape may be the commonly known blue tape.

The first adhesive 103 may be used to glue the first carrier wafer 101 to other devices such as a first semiconductor die 201 and a second semiconductor die 203 (not illustrated in FIG. 1 but illustrated and discussed below with respect to FIG. 2). In an embodiment the adhesive may be a thermal release film. Alternatively, the first adhesive 103 may be an ultraviolet (UV) glue, which loses its adhesive property when exposed to UV lights. Any suitable adhesive may be utilized, and all such adhesives are fully intended to be included within the scope of the embodiments.

Figure 2:
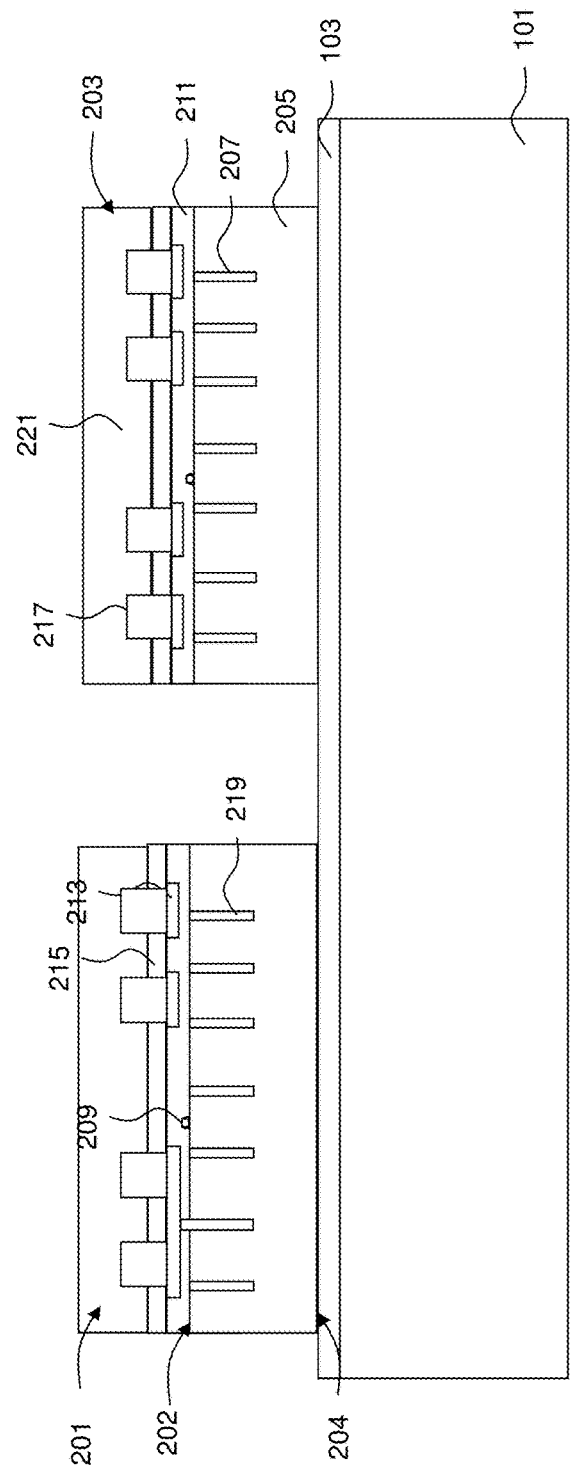

FIG. 2 illustrates a first semiconductor die 201 (or first bottom die) and a second semiconductor die 203 (or second bottom die) being attached to the first carrier wafer 101 with the first adhesive. Both the first semiconductor die 201 and the second semiconductor die 203 may comprise a substrate 205, through substrate via (TSV) openings 207, active devices 209, metallization layers 211, contact pads 213, first passivation layers 215, and first external connectors 217. However, while the first semiconductor die 201 and the second semiconductor die 203 are illustrated as having similar features, this is intended to be illustrative and is not intended to limit the embodiments, as the first semiconductor die 201 and the second semiconductor die 203 may have similar structures or different structures in order to meet the desired functional capabilities intended for the first semiconductor die 201 and the second semiconductor die 203.

Additionally, while a single first semiconductor die 201 and a single second semiconductor die 203 are illustrated in FIG. 2, this is intended to be illustrative only, and is not intended to be limiting to the embodiments. Rather, the single first semiconductor die 201 may be representative of one or more first semiconductor dies 201 that will have through substrate vias (TSVs; discussed further below with respect to FIG. 7) eventually formed therein and stacked together. Similarly, the single second semiconductor die 203 may be representative of one or more second semiconductor dies 203 that will have TSVs eventually formed therein and stacked together. Any suitable number of first semiconductor dies 201 and second semiconductor dies 203 may alternatively be utilized, and all such combinations are fully intended to be included within the scope of the embodiments.

The substrates 205 may comprise bulk silicon, doped or undoped, or an active layer of a silicon-on-insulator (SOI) substrate and may have a first side 202 and a second side 204. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The through silicon via (TSV) openings 207 may be formed into the first side 202 of the substrates 205. The TSV openings 207 may be formed by applying and developing a suitable photoresist (not shown), and removing substrate 205 that is exposed to the desired depth. The TSV openings 207 may be formed so as to extend into the substrates 205 at least further than the active devices 209 formed within and/or on the substrates 205, and may extend to a depth greater than the eventual desired height of the substrates 205. Accordingly, while the depth is dependent upon the overall designs of the first semiconductor die 201 and the second semiconductor die 203, the depth may be between about 20 μm and about 200 μm from the active devices 209 on the substrates 205, such as a depth of about 100 μm from the active devices 209 on the substrates 205.

Once the TSV openings 207 have been formed within the substrates 205, the TSV openings 207 may be lined with a liner (not independently illustrated in FIG. 2). The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. Additionally, the liner may be formed to a thickness of between about 0.1 μm and about 5 μm, such as about 1 μm.

Once the liner has been formed along the sidewalls and bottom of the TSV openings 207, a barrier layer (also not independently illustrated) may be formed and the remainder of the TSV openings 207 may be filled with first conductive material 219. The first conductive material 219 may comprise copper, although other suitable materials such as aluminum, alloys, doped polysilicon, combinations thereof, and the like, may alternatively be utilized. The first conductive material 219 may be formed by electroplating copper onto a seed layer (not shown), filling and overfilling the TSV openings 207. Once the TSV openings 207 have been filled, excess liner, barrier layer, seed layer, and first conductive material 219 outside of the TSV openings 207 may be removed through a planarization process such as chemical mechanical polishing (CMP), although any suitable removal process may be used.

The active devices 209 are represented in FIG. 2 as a single transistor on each of the substrates 205. However, as one of skill in the art will recognize, a wide variety of active devices and passive devices such as capacitors, resistors, inductors and the like may be used to generate the desired structural and functional requirements of the design for the first semiconductor die 201 and the second semiconductor die 203. The active devices 209 may be formed using any suitable methods either within or else on the first side 202 of the substrates 205.

The metallization layers 211 are formed over the first side 202 of the substrates 205 and the active devices 209 and are designed to connect the various active devices 209 to form functional circuitry. While illustrated in FIG. 2 as a single layer of dielectric and interconnects, the metallization layers 211 are formed of alternating layers of dielectric and conductive material and may be formed through any suitable process (such as deposition, damascene, dual damascene, etc.). In an embodiment there may be four layers of metallization separated from the substrates 205 by at least one interlayer dielectric layer (ILD), but the precise number of metallization layers 211 is dependent upon the design of the first semiconductor die 201 and the second semiconductor die 203.

The contact pads 213 may be formed over and in electrical contact with the metallization layers 211. The contact pads 213 may comprise aluminum, but other materials, such as copper, may alternatively be used. The contact pads 213 may be formed using a deposition process, such as sputtering, to form a layer of material (not shown) and portions of the layer of material may then be removed through a suitable process (such as photolithographic masking and etching) to form the contact pads 213. However, any other suitable process may be utilized to form the contact pads 213. The contact pads 213 may be formed to have a thickness of between about 0.5 μm and about 4 μm, such as about 1.45 μm.

The first passivation layers 215 may be formed on the substrates 205 over the metallization layers 211 and the contact pads 213. The first passivation layers 215 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layers 215 may be formed through a process such as chemical vapor deposition (CVD), although any suitable process may be utilized, and may have a thickness between about 0.5 μm and about 5 μm, such as about 9.25 KÅ.

Second passivation layers 1002 (not individually illustrated in FIG. 2 for clarity, but illustrated in the close up view below with respect to FIG. 10B) may be formed over the first passivation layers 215 in order to provide further protection. In an embodiment the second passivation layers 1002 may be formed from a polymer such as polyimide, or may alternatively be formed of a similar material as the first passivation layers 107 (e.g., silicon oxides, silicon nitrides, low-k dielectrics, extremely low-k dielectrics, combinations of these, and the like). The second passivation layers 113 may be formed to have a thickness of between about 2 μm and about 15 μm, such as about 5 μm.

The first external connectors 217 may be formed to provide conductive regions for contact between the contact pads 213 and external devices (not illustrated in FIG. 2) such as printed circuit boards or other semiconductor dies in, e.g., a flip-chip arrangement. The first external connectors 217 may also be utilized as a buffer in a planarization process such as chemical mechanical polishing (CMP). In an embodiment the first external connectors 217 may be conductive pillars and may be formed by initially forming a photoresist (not shown) over the first passivation layers 215 and the second passivation layers 1002 to a thickness between about 5 μm to about 20 μm, such as about 10 μm. The photoresist may be patterned to expose portions of the first passivation layers 215 and the second passivation layers 1002 through which the conductive pillars will extend. Once patterned, the photoresist may then be used as a mask to remove the desired portions of the first passivation layers 215 and the second passivation layers 1002, thereby exposing those portions of the underlying contact pads 213 to which the conductive pillars will make contact.

Once the contact pads 213 have been exposed, first UBM layers 1003 (not individually illustrated in FIG. 2 but illustrated in a close-up view below with respect to FIG. 10B) may be formed in electrical contact with the contact pad 105. The first UBM layers 1003 may comprise a layer of conductive material, such as a layer of titanium, or a layer of nickel. The first UBM layers 1003 may comprise multiple sub-layers, not shown. One of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the first UBM layers 1003. Any suitable materials or layers of material that may be used for the first UBM layers 1003 are fully intended to be included within the scope of the current embodiments. The first UBM layers 1003 may be created using processes such as sputtering, evaporation, or PECVD process, depending upon the desired materials. The first UBM layers 1003 may be formed to have a thickness of between about 0.7 µm and about 10 µm, such as about 5 µm.

After the first UBM layers 1003 have been formed, the conductive pillars may be formed within the openings of both the first passivation layers 215, the second passivation layers 1002, and the photoresist. The conductive pillars may be formed from a conductive material such as copper, although other conductive materials such as nickel, gold, or metal alloy, combinations of these, or the like may also be used. Additionally, the conductive pillars may be formed using a process such as electroplating, by which an electric current is run through the conductive portions of the contact pads 213 to which the conductive pillars are desired to be formed, and the contact pads 213 are immersed in a solution. The solution and the electric current deposit, e.g., copper, within the openings in order to fill and/or overfill the openings of the photoresist, the first passivation layers 215, and the second passivation layers 1002, thereby forming the conductive pillars. Excess conductive material outside of the openings may then be removed using, for example, a chemical mechanical polish (CMP).

After the conductive pillars have been formed, the photoresist may be removed through a process such as ashing, whereby the temperature of the photoresist is increased until the photoresist decomposes and may be removed. After the removal of the photoresist, the conductive pillars extend away from the first passivation layers 215 and the second passivation layers 1002 a first distance of between about 5 µm to about 50 µm, such as 40 µm. Optionally, a barrier layer (not shown) may be formed over the conductive pillars by, for example, electroless plating, wherein the barrier layer may be formed of nickel, vanadium (V), chromium (Cr), and combinations thereof.

However, as one of ordinary skill in the art will recognize, the above described process to form the conductive pillars is merely one such description, and is not meant to limit the embodiments to this exact process. Rather, the described process is intended to be merely illustrative, as any suitable process for forming the first external connectors 217 may alternatively be utilized. For example, forming the first passivation layers 215 and the second passivation layers 1002 to a thickness greater than its eventual thickness, forming the conductive pillars into an opening of the first passivation layers 215 and the second passivation layers 1002, and then removing a top portion of the first passivation layers 215 and the second passivation layers 1002 such that the conductive pillars extend away from the first passivation layers 215 and the second passivation layers 1002 may also be utilized. All suitable processes are fully intended to be included within the scope of the present embodiments.

Optionally, a protective layer 221 may be formed over the first external connectors 217 in order to protect the first external connectors 217. In an embodiment the protective layer 221 may be a protective layer such as a polymer layer, although any suitable material may alternatively be utilized. The protective layer 221 may be formed to have a thickness of between about 5 µm and about 15 µm, such as about 8 µm.

FIG. 3 illustrates a first molding process in order to encapsulate the first semiconductor die 201 and the second semiconductor die 203 while the first semiconductor die 201 and the second semiconductor die 203 remain affixed to the first carrier wafer 101. In an embodiment the first semiconductor die 201 and the second semiconductor die 203 may be encapsulated using, e.g., a molding device (not illustrated). For example, the first semiconductor die 201, the second semiconductor die 203, and the first carrier wafer 101 may be placed within a cavity of the molding device, and the cavity may be hermetically sealed. An encapsulant 301 may be placed within the cavity either before the cavity is hermetically sealed or else may be injected into the cavity through an injection port. In an embodiment the encapsulant 301 may be a molding compound resin such as polyimide, PPS, PEEK, PES, a heat resistant crystal resin, combinations of these, or the like.

Once the encapsulant 301 has been placed into the cavity such that the encapsulant 301 encapsulates the first semiconductor die 201 and the second semiconductor die 203, the encapsulant 301 may be cured in order to harden the encapsulant 301 for optimum protection. While the exact curing process is dependent at least in part on the particular material chosen for the encapsulant 301, in an embodiment in which molding compound is chosen as the encapsulant 301, the curing could occur through a process such as heating the encapsulant 301 to between about 100° C. and about 130° C., such as about 125° C. for about 60 sec to about 3000 sec, such as about 600 sec. Additionally, initiators and/or catalysts may be included within the encapsulant 301 to better control the curing process.

However, as one having ordinary skill in the art will recognize, the curing process described above is merely an exemplary process and is not meant to limit the current embodiments. Other curing processes, such as irradiation or even allowing the encapsulant 301 to harden at ambient temperature, may alternatively be used. Any suitable curing process may be used, and all such processes are fully intended to be included within the scope of the embodiments discussed herein.

FIG. 4 illustrates a removal of the encapsulant 301 to expose the first external connectors 217. In an embodiment the removal of the encapsulant 301 may be performed using, e.g., a chemical mechanical polishing (CMP) process, whereby abrasives and etchants are applied to the encapsulant 301 and polished in order to react with and grind away the encapsulant 301 until the first external connectors 217 are exposed. Alternatively, one or more etching processes may be utilized to remove the encapsulant 301 and planarize the encapsulant 301 with the first external connectors 217.

Figure 5:
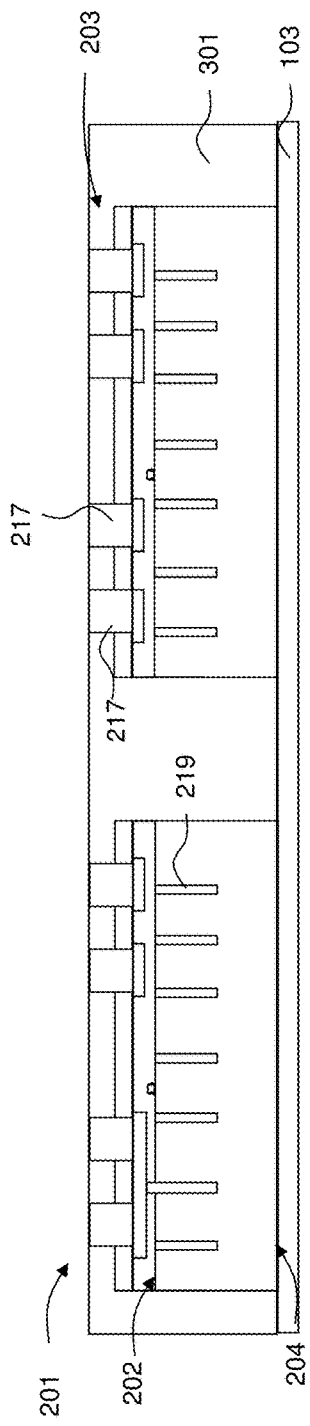

FIG. 5 illustrates a removal of the first carrier wafer 101 from the first semiconductor die 201 and the second semiconductor die 203. While the removal of the first carrier wafer 101 is at least in part dependent upon the type of first adhesive 103 utilized, in an embodiment in which the first adhesive 103 is a thermal release film the first adhesive 103 may be heated to a temperature of greater than about 200° C. in order to release the first carrier wafer 101 from the first semiconductor die 201 and the second semiconductor die 203. Any other suitable method of removing the first carrier wafer 101, such as irradiating the first adhesive 103 with UV light when the first adhesive 103 is a UV glue, may alternatively be utilized.

Figure 6:
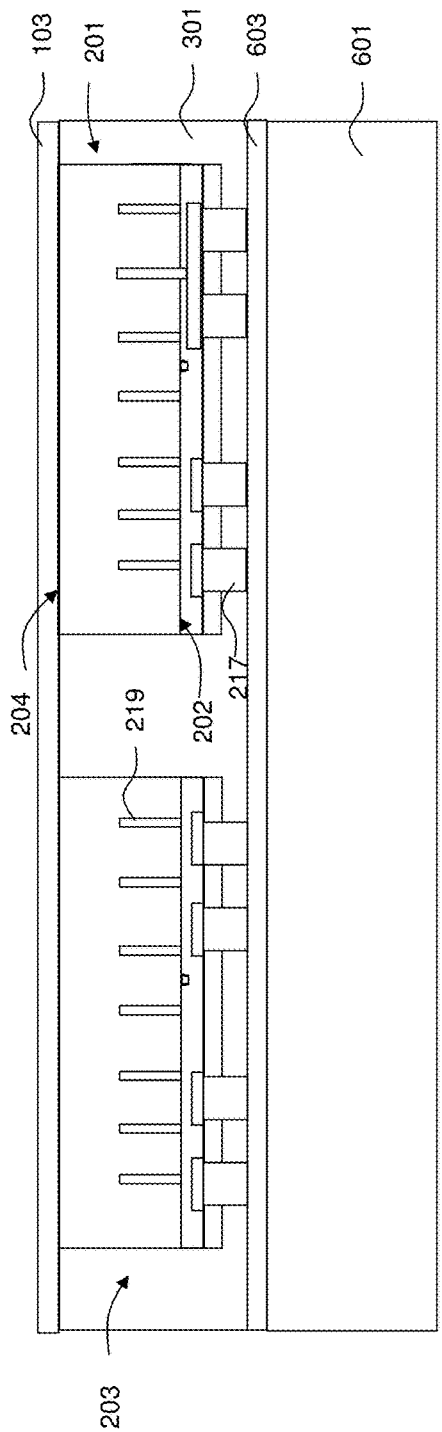

FIG. 6 illustrates an attachment of a second carrier wafer 601 to the encapsulant 301 and the first external connectors 217 utilizing a second adhesive 603. In an embodiment the second carrier wafer 601 and the second adhesive 603 may be similar to the first carrier wafer 101 and the first adhesive 103, respectively, such as by being a glass carrier wafer and a thermal release film. However, the second carrier wafer 601 and the second adhesive 603 may alternatively be different from the first carrier wafer 101 and the first adhesive 103.

Figure 7:
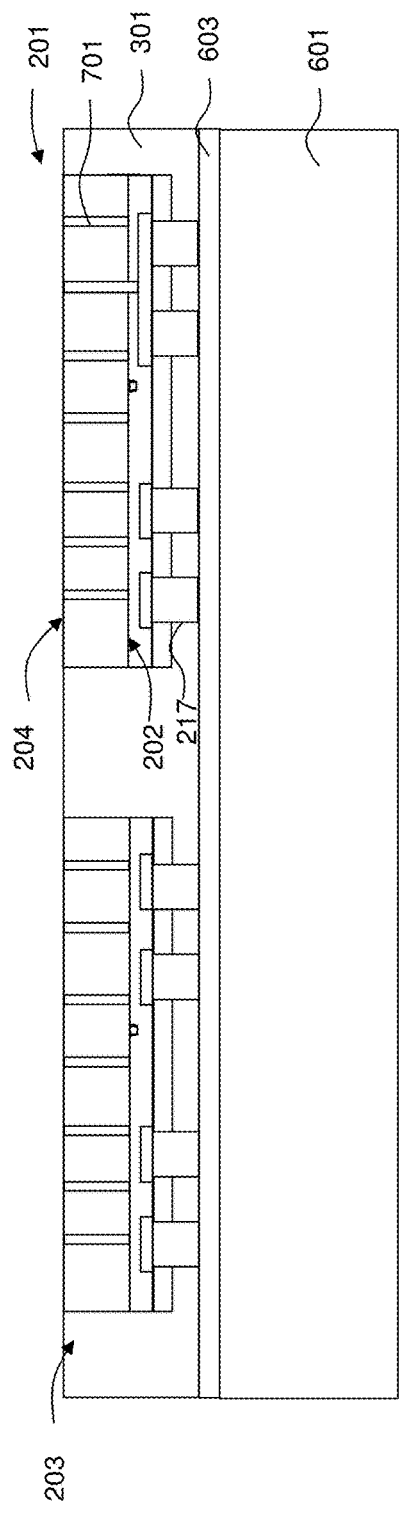

FIG. 7 illustrates a removal of the encapsulant 301 and portions of the second side 204 of the substrates 205 to expose the TSV openings 207 and form TSVs 701. In an embodiment the encapsulant 301 and the second side 204 of the substrates 205 may be removed using, e.g., CMP and grinding processes to both remove the encapsulant 301 and portions of the second side 204 of the substrates 205 and also to planarize the encapsulant 301 and the second side 204 of the substrates 205. Alternatively, one or more etching processes or other removal processes may also be used to remove the encapsulant 301 and to expose the TSV openings 207 to form the TSVs 701.

Figure 8:
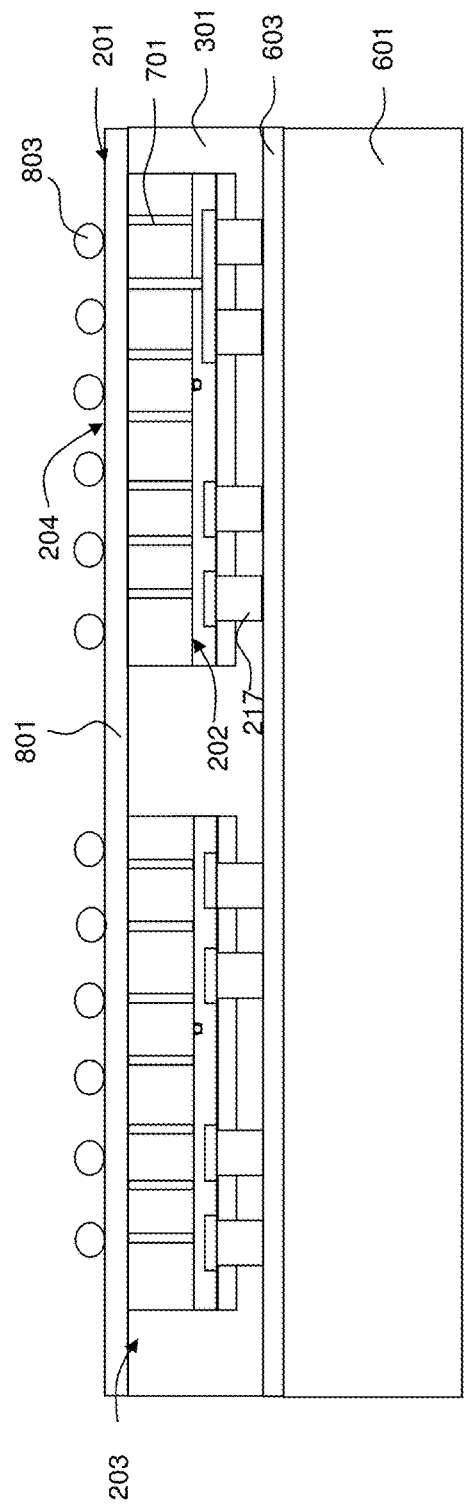

FIG. 8 illustrates a formation of a first redistribution layer (RDL) 801 and second external connectors 803 on the second side 204 of the substrates 205. The first RDL 801 may comprise two conductive layers formed of metals such as aluminum, copper, tungsten, titanium, and combinations thereof. The first RDL 801 may be formed by depositing the metal layers through chemical vapor deposition and then etching the undesired portions, leaving the first RDL 801. The first RDL 801 may be between about 2 μm and about 30 μm, such as about 5 μm. However, other materials and process, such as a well-known damascene process, could alternatively be used to form the first RDL 801.

Optionally, in an embodiment the first RDL 801 may be formed not only over the first semiconductor die 201 and the second semiconductor die 203, but may also be formed over the encapsulant 301. By forming the first RDL 801 over the encapsulant 301, a fan-out area for the first semiconductor die 201 and the second semiconductor die 203 may be extended beyond the boundaries of the first semiconductor die 201 and the second semiconductor die 203, which also allows for an increase in the input/output (I/O) counts.

The second external connectors 803 may be contact bumps such as microbumps or controlled collapse chip connection (C4) bumps and may comprise a material such as tin, or other suitable materials, such as silver or copper. In an embodiment in which the second external connectors 803 are tin solder bumps, the second external connectors 803 may be formed by initially forming a layer of tin through any suitable method such as evaporation, electroplating, printing, solder transfer, ball placement, etc., to a preferred thickness of about 100 μm. Once a layer of tin has been formed on the structure, a reflow is performed in order to shape the material into the desired bump shape.

Figure 9A:
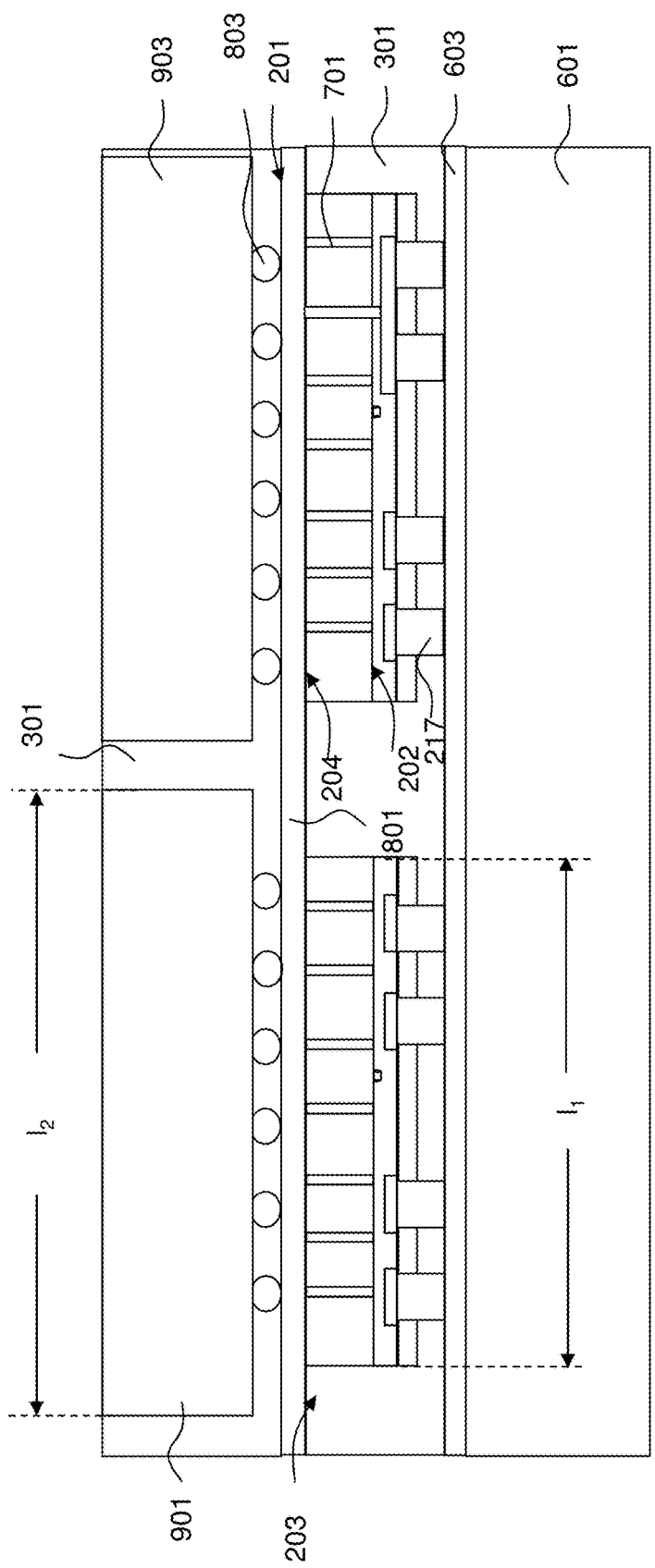

FIG. 9A illustrates an attachment of a third semiconductor die 901 (or third top die) and a fourth semiconductor die 903 (or fourth top die) to the second semiconductor die 203 and the first semiconductor die 201, respectively. In an embodiment the third semiconductor die 901 and the fourth semiconductor die 903 may contain active devices, metallization layers, and contact pads (all of which are not shown for clarity) similar to the first semiconductor die 201 and the second semiconductor die 203, although they may also contain different structures and may perform different or complementary functionalities as the semiconductor dies to which they are attached.

In an embodiment the third semiconductor die 901 may be larger than the underlying second semiconductor die 203. For example, in an embodiment in which the second semiconductor die 203 may have a first length $l_1$ of between about 3 mm and about 14 mm, such as about 8 mm, the third semiconductor die 901 may have a second length $l_2$ of between about 1 mm and about 20 mm, such as about 10 mm. By having larger dimensions than the second semiconductor die 203, the third semiconductor die 901 may overhang the second semiconductor die 203. However, the encapsulant 301 and the RDL 801 may be utilized to provide the support and connectivity to the second semiconductor die 203 and the third semiconductor die 901.

However, as one of ordinary skill in the art will recognize, having the second length $l_2$ be greater than the first length $l_1$ as illustrated in FIG. 9A is one embodiment, this description is intended to be illustrative and is not intended to limit the embodiment. In other embodiments, the second length $l_2$ may be larger than, smaller than the first length, or equal to the first length $l_1$. All sizes and dimensions of the first length $l_1$ and the second length $l_2$ are fully intended to be included within the scope of the embodiments.

In an embodiment the third semiconductor die 901 and the fourth semiconductor die 903 may be bonded to the second semiconductor die 203 and the first semiconductor die 201 by first aligning the third semiconductor die 901 to the second semiconductor die 203 and aligning the fourth semiconductor die 903 to the first semiconductor die 201. Once aligned, a reflow may be performed to reflow the material of the second external connectors 803 and bond the dies together. Any suitable method of bonding, however, such as copper-copper bonding, may alternatively be utilized to bond the first semiconductor die 201, the second semiconductor die 203, the third semiconductor die 901, and the fourth semiconductor die 903.

Optionally, FIG. 9A also illustrates an encapsulation of the third semiconductor die 901 and the fourth semiconductor die 903. In an embodiment a second molding process may be used to encapsulate the third semiconductor die 901 and the fourth semiconductor die 903, and the second molding process may be similar to the first molding process used to encapsulate the first semiconductor die 201 and the second semiconductor die 203. For example, the encapsulant 301 may be placed into a molding chamber along with the first semiconductor die 201, the second semiconductor die 203, the third semiconductor die 901, and the fourth semiconductor die 903 as described above with respect to FIG. 3. However, while the second molding process may be similar to the first molding process, it may alternatively use different materials and different processes while remaining within the scope of the embodiments.

By encapsulating the third semiconductor die 901 and the fourth semiconductor die 903, the first RDL 801 may be located between two sets of the encapsulant 301. Such a location helps to provide support for portions of the first RDL 801 that are not located directly between the first semiconductor die 201, the second semiconductor die 203, the third semiconductor die 901, and the fourth semiconductor die 903. By providing better protection, future deterioration of the first RDL 801 may be reduced or eliminated.

Also optionally, the encapsulant 301 utilized to encapsulate the third semiconductor die 901 and the fourth semiconductor die 903 may be planarized with the third semiconductor die 901 and the fourth semiconductor die 903 in order to expose the third semiconductor die 901 and the fourth semiconductor die 903. In an embodiment the encapsulant 301 may be planarized and removed using, e.g., a CMP process to react and grind away the encapsulant 301 until the third semiconductor die 901 and the fourth semiconductor die 903 are exposed.

Additionally, while only a single third semiconductor die 901 and a single fourth semiconductor die 903 are illustrated in FIG. 9A, this is merely intended to be illustrative and is not intended to be limiting upon the embodiments. In alternative embodiments the single third semiconductor die 901 illustrated in FIG. 9A may be representative of multiple semiconductor dies that are desired to be electrically connected to the second semiconductor die 203. Similarly, the single fourth semiconductor die 903 illustrated in FIG. 9A may be representative of multiple semiconductor dies that are desired to be electrically connected to the first semiconductor die 201. Any combination of numbers for the third semiconductor die 901 and the fourth semiconductor die 903 may alternatively be utilized, and all such combinations are fully intended to be included within the scope of the embodiments.

Figure 9B:
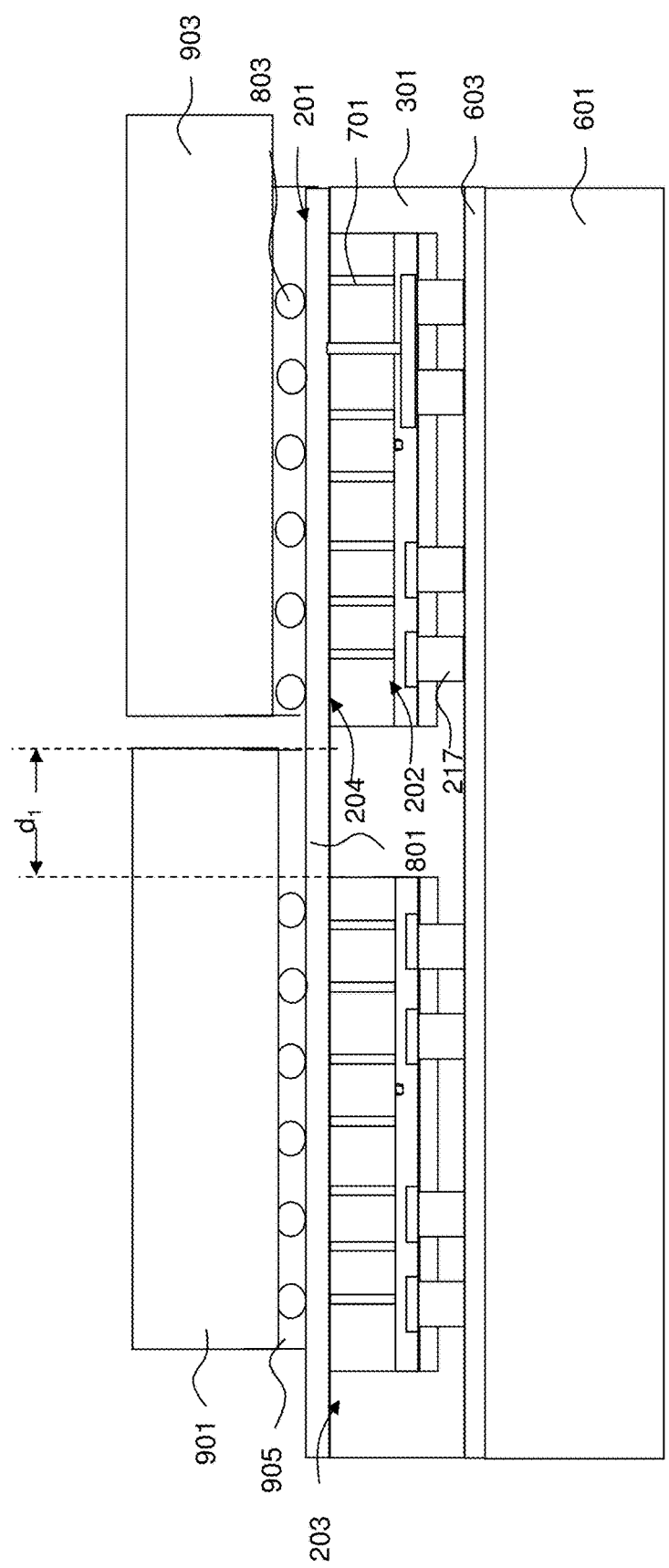

FIG. 9B illustrates an alternative placement of the third semiconductor die 901 and the fourth semiconductor die 903. In this embodiment the third semiconductor die 901 and the fourth semiconductor die 903, instead of simply overhanging the first semiconductor die 201 and the second semiconductor die 203, are, rather, placed so that they are offset from their respective dies. In an embodiment the third semiconductor die 901 and the fourth semiconductor die 903 may be offset a first distance $d_1$ of between about 100 um and about 3 mm, such as about 1.5 mm.

Optionally, an underfill material 905 may be injected or otherwise formed in the space between the first semiconductor die 201, the second semiconductor die 203, the third semiconductor die 901, and the fourth semiconductor die 903. The underfill material 905 may, for example, comprise a liquid epoxy that is dispensed between the first semiconductor die 201, the second semiconductor die 203, the third semiconductor die 901, and the fourth semiconductor die 903, and then cured to harden. This underfill material 905 may be used to prevent cracks from being formed in the third external connectors 805, wherein cracks are typically caused by thermal stresses.

Alternatively, either a deformable gel or silicon rubber could be formed between the first semiconductor die 201, the second semiconductor die 203, the third semiconductor die 901, and the fourth semiconductor die 903 in order to help prevent cracks from occurring within the second external connectors 803. This gel or silicon rubber may be formed by injecting or otherwise placing the gel or rubber between the first semiconductor die 201, the second semiconductor die 203, the third semiconductor die 901, and the fourth semiconductor die 903. The deformable gel or silicon rubber may also provide stress relief during subsequent processing.

Figure 10A:
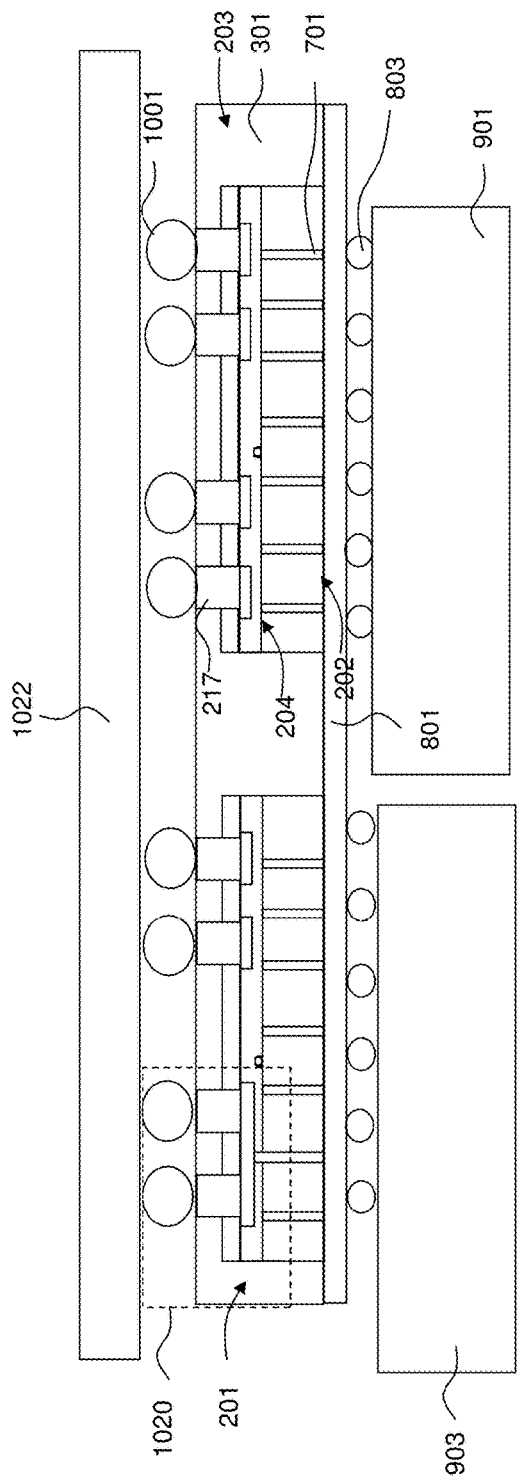

FIG. 10A illustrates a removal of the second carrier wafer 601 and the second adhesive 603, and the formation of third external connectors 1001 to the first external connectors 217. In an embodiment in which the second adhesive 603 is a thermal release film, the second adhesive 603 and the second carrier wafer 601 may be removed by increasing the temperature of the second adhesive 603 to greater than about 200° C., such that the second carrier wafer 601 is easily removable. Alternatively, in an embodiment in which the second adhesive 603 is a UV glue, the second adhesive 603 may be irradiated with UV light in order to remove the second carrier wafer 601 and the second adhesive 603.

Once the second carrier wafer 601 and the second adhesive 603 have been removed, the third external connectors 1001 may be formed in contact with the first external connectors 217. In an embodiment the third external connectors 1001 may be contact bumps such as controlled collapse chip connection (C4) bumps or microbumps and may comprise a material such as tin, or other suitable materials, such as silver or copper. In an embodiment in which the third external connectors 1001 are tin solder bumps, the third external connectors 1001 may be formed by initially forming a layer of tin through any suitable method such as evaporation, electroplating, printing, solder transfer, ball placement, etc, to a preferred thickness of about 100 μm. Once a layer of tin has been formed on the structure, a reflow is preferably performed in order to shape the material into the desired bump shape.

FIG. 10A also illustrates a connection of the first semiconductor die 201 and the second semiconductor die 203 to a second substrate 1022. The second substrate 1022 may be utilized to support and protect the first semiconductor die 201 and the second semiconductor die 203 while also being used to provide a connection between the third external connectors 1001 on the first semiconductor die 201 and the second semiconductor die 203 to external devices (not shown). In an embodiment the second substrate 1022 may be a printed circuit board and may be a laminate substrate formed as a stack of multiple thin layers (or laminates) of a polymer material such as bismaleimide triazine (BT), FR-4, or the like. However, any other suitable substrate, such as an organic substrate, a ceramic substrate, or the like, may alternatively be utilized, and all such substrates that provide support and connectivity to the first semiconductor die 201 and the second semiconductor die 203 are fully intended to be included within the scope of the embodiments.

Figure 10B:
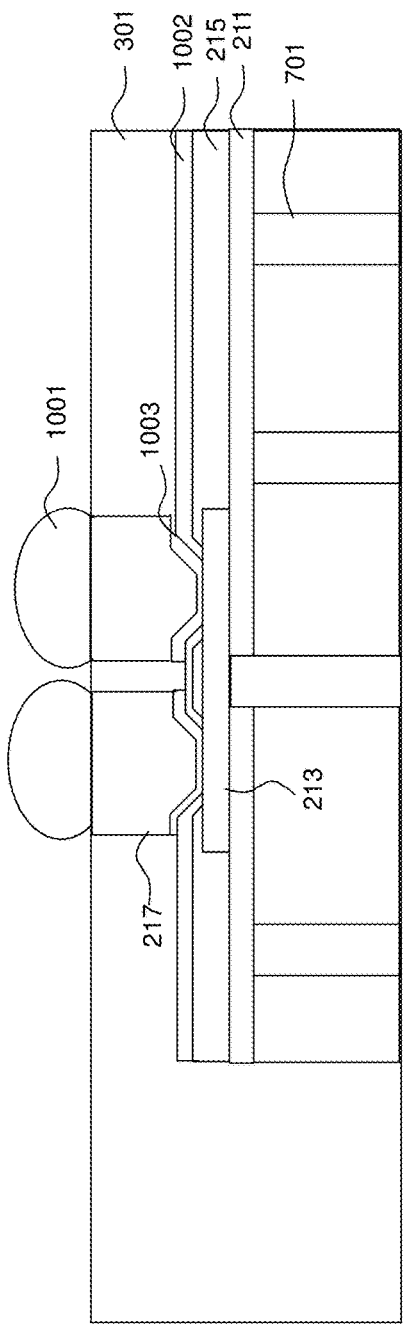

FIG. 10B illustrates a close-up, more detailed view of a portion of FIG. 10A surrounded by the dashed line 1020. As can be seen, the first external connectors 217 extend away from the first UBM layers 1003 through the encapsulant 301. As such, the encapsulant 301 may provide additional support and protection to the first external connectors 217 while also providing support and protection to the remainder of the first semiconductor die 201.

Figure 10C:
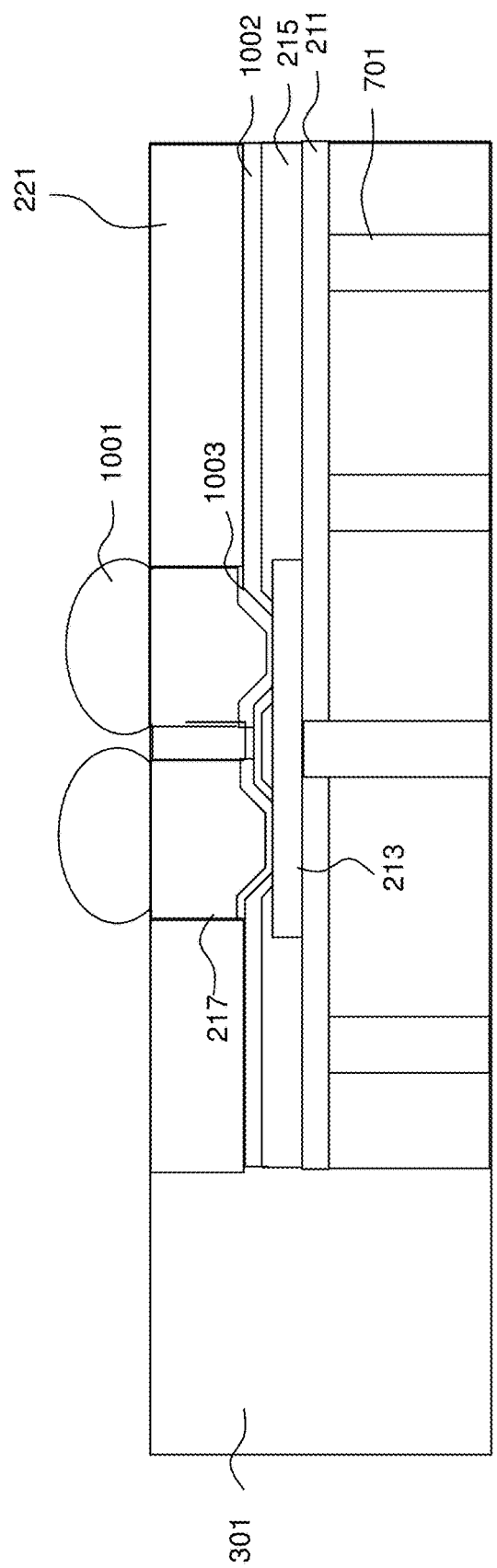
Figure 10D:
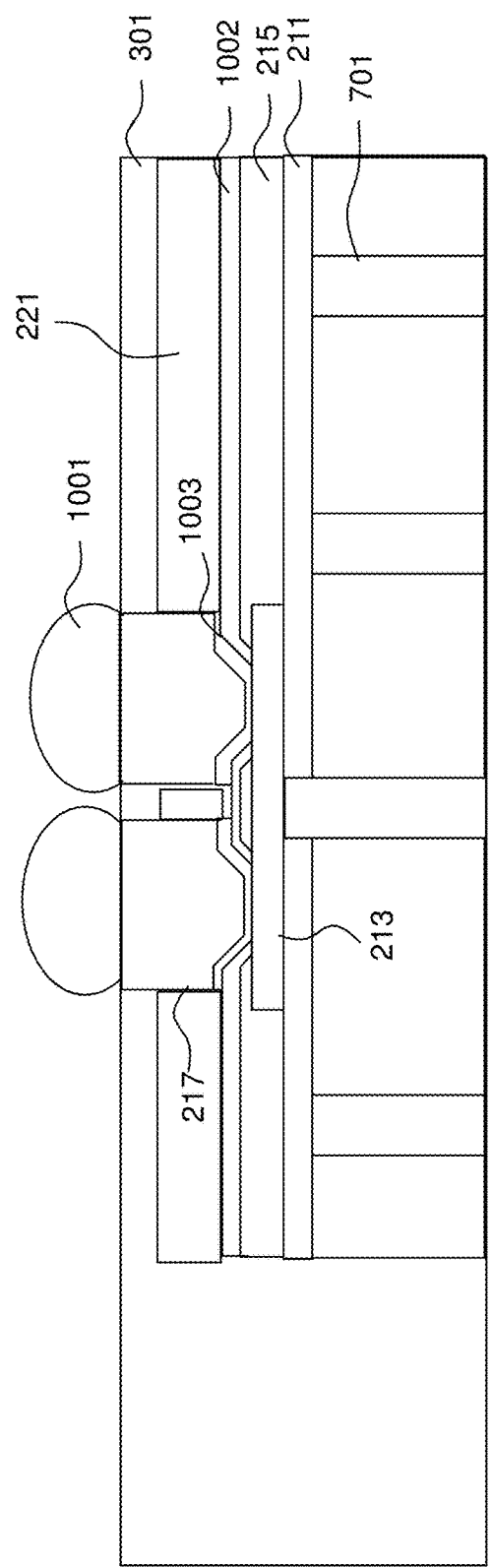

FIGS. 10C and 10D illustrate embodiments in which the optional protective layer 221 may be used to protect the first external connectors 217. FIG. 10C illustrates one embodiment in which the protective layer 221 may be formed to be planar with a top surface of the first external connectors 217 using, e.g., a planarization process such as a CMP process. FIG. 10D illustrates an alternative embodiment in which the protective layer 221 protects a portion of the first external connectors 217 but does not extend all the way to the top surface of the first external connectors 217.

By utilizing the embodiment described herein, a chip on wafer process or chip on wafer on substrate process allows for a top die (e.g., the third semiconductor die 901 or the fourth semiconductor die 903) to overhang or have a larger dimension than a bottom die (e.g., the first semiconductor die 201 or the second semiconductor die 203). These embodiments also allow for a reduction in the form factor by using ball grid arrays to connect the first semiconductor die 201, the second semiconductor die 203, the third semiconductor die 901, and the fourth semiconductor die 903, and allow for greater processing flexibility, as the first semiconductor die 201 and the second semiconductor die 203 may be connected to the third semiconductor die 901 and the fourth semiconductor die 903 prior to being attached to another substrate (such as a printed circuit board). Such flexibility means that the attachment to the printed circuit board may be eliminated or rearranged, thereby potentially lowering assembly costs.

Figure 11:
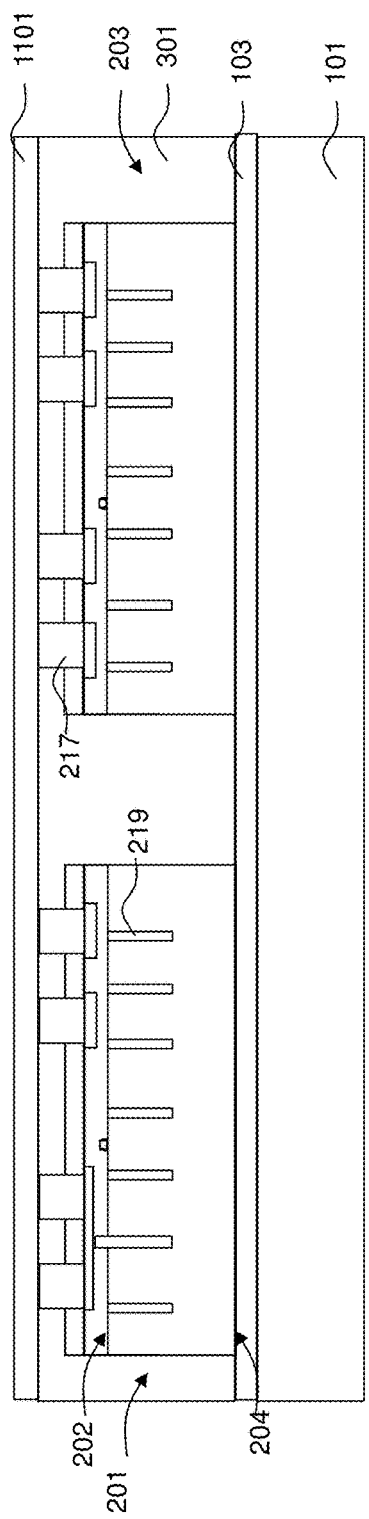
FIGS. 11-13D illustrate an alternative embodiment of a manufacturing process to connect semiconductor devices in accordance with an embodiment.

FIG. 11 illustrates yet another embodiment in which a second RDL 1101 is formed over the first side 202 of the first semiconductor die 201 and the second semiconductor die 203. In an embodiment the second RDL 1101 may be formed after the encapsulant 301 has been removed to expose the first external connectors 217 and before the first carrier 101 has been removed. The second RDL 1101 may be formed in similar fashion and using similar materials as the first RDL 801 described above with respect to FIG. 8. For example, the second RDL 1101 may comprise two conductive layers formed of metals such as aluminum, copper, tungsten, titanium, and combinations thereof, and may be formed using a chemical vapor deposition and patterning process. However, the second RDL 1101 may alternatively be formed from using different materials and different processes than the first RDL 801.

Figure 12:
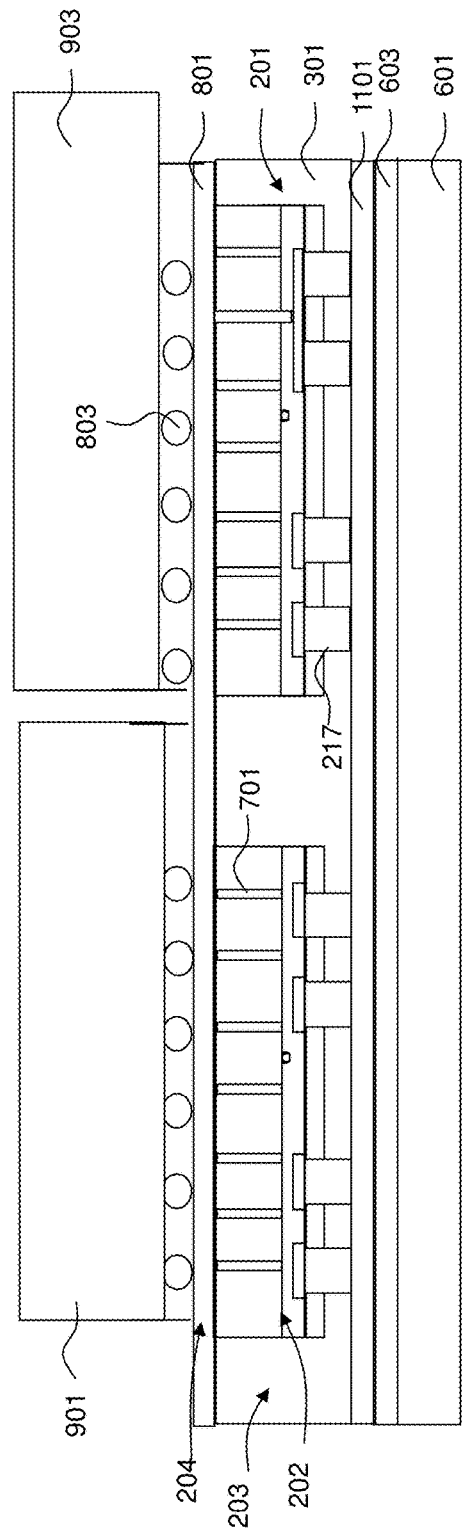

FIG. 12 illustrates a resulting structure after the first carrier 101 has been removed, the second carrier wafer 601 has been attached to the second RDL 1101 using, e.g., the second adhesive 603, the first semiconductor die 201 and the second semiconductor die 203 have been thinned to form the TSVs 701, the first RDL 801 and the second external connectors 803 have been formed over the second side 204 of the first semiconductor die 201 and the second semiconductor die 203, and the third semiconductor die 901 and the fourth semiconductor die 903 have been bonded to the second semiconductor die 203 and the first semiconductor die 201.

Figure 13A:
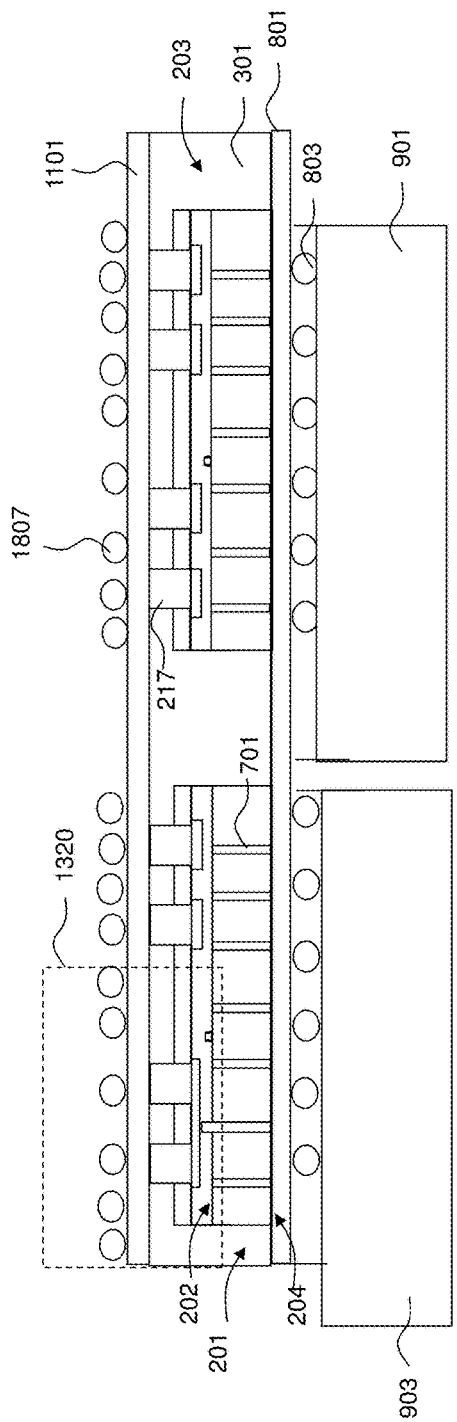
Figure 13B:
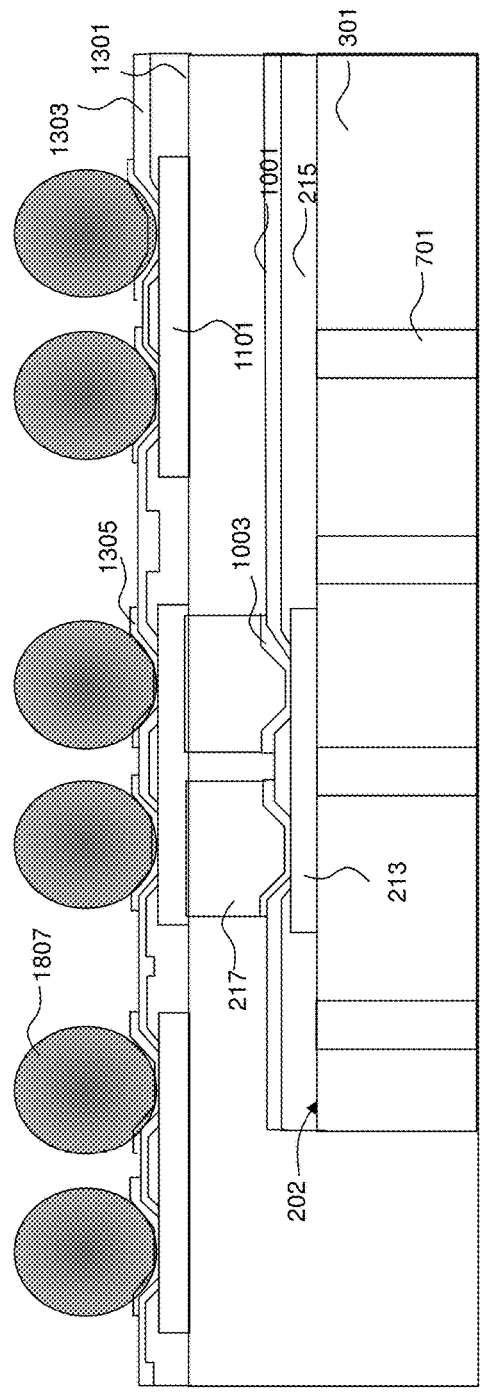

FIGS. 13A-13B illustrate a removal of the second carrier wafer 601 and second adhesive 603 from the second RDL 1101, and a formation of fifth external connectors 1307 in connection with the second RDL 1101, with FIG. 13B illustrating a close-up and more detailed view of a region of FIG. 13A demarcated by the dashed box 1320. In an embodiment in which the second adhesive 603 is a thermal release film, the second carrier wafer 601 may be removed by increasing the temperature of the second adhesive 603 until the second carrier wafer 601 may be removed.

Once the second carrier wafer 601 has been removed, a third passivation layer 1301 may be formed over the second RDL 1101 in order to provide protection to the second RDL 1101. The third passivation layer 1301 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The third passivation layer 1301 may be formed through a process such as chemical vapor deposition (CVD), although any suitable process may be utilized, and may have a thickness between about 0.5 µm and about 5 µm, such as about 9.25 KÅ.

A fourth passivation layer 1303 may be formed over the third passivation layer 1301 in order to provide further protection. In an embodiment the fourth passivation layer 1303 may be formed from a polymer such as polyimide, or may alternatively be formed of a similar material as the third passivation layer 1301 (e.g., silicon oxides, silicon nitrides, low-k dielectrics, extremely low-k dielectrics, combinations of these, and the like). The fourth passivation layer 1303 may be formed to have a thickness of between about 2 µm and about 15 µm, such as about 5 µm.

After the fourth passivation layer 1303 has been formed, the third passivation layer 1301 and the fourth passivation layer 1303 may be patterned using, e.g., a photolithographic masking and etching process, to expose portions of the second RDL 1101. Once the second RDL 1101 has been exposed, second UBM layers 1305 may be formed in electrical contact with the second RDL 1101. The second UBM layers 1305 may comprise a layer of conductive material, such as a layer of titanium, or a layer of nickel. The second UBM layers 1305 may comprise multiple sub-layers, not shown. One of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the second UBM layers 1305. Any suitable materials or layers of material that may be used for the second UBM layers 1305 are fully intended to be included within the scope of the current embodiments. The second UBM layers 1305 may be created using processes such as sputtering, evaporation, or PECVD process, depending upon the desired materials. The second UBM layers 1305 may be formed to have a thickness of between about 0.7 µm and about 10 µm, such as about 5 µm.

Once the second UBM layers 1305 has been formed, the fifth external connectors 1307 may be formed in electrical connection with the second RDL 1101. The fifth external connectors 1307 may be contact bumps such as microbumps or controlled collapse chip connection (C4) bumps and may comprise a material such as tin, or other suitable materials, such as silver or copper. In an embodiment in which the fifth external connectors 1307 are tin solder bumps, the fifth external connectors 1307 may be formed by initially forming a layer of tin through any suitable method such as evaporation, electroplating, printing, solder transfer, ball placement, etc., to a preferred thickness of about 100 µm. Once a layer of tin has been formed on the structure, a reflow is preferably performed in order to shape the material into the desired bump shape.

FIGS. 13C and 13D illustrate embodiments in which the optional protective layer 221 may be used to protect the first external connectors 217. FIG. 13C illustrates one embodiment in which the protective layer 221 may be formed to be planar with a top surface of the first external connectors 217 using, e.g., a planarization process such as a CMP process. FIG. 10D illustrates an alternative embodiment in which the protective layer 221 protects a portion of the first external connectors 217 but does not extend all the way to the top surface of the first external connectors 217.

Optionally, although not illustrated in FIGS. 13A-13B, the third semiconductor die 901 and the fourth semiconductor die 903 may be encapsulated in this embodiment as well. In an embodiment the third semiconductor die 901 and the fourth semiconductor die 903 may be encapsulated in a similar manner that the first semiconductor die 201 and the second semiconductor die 203 were encapsulated (discussed above with respect to FIG. 3). However, an alternate encapsulant or different method may be utilized to encapsulate the third semiconductor die 901 and the fourth semiconductor die 903.

By utilizing the embodiments described above with respect to FIGS. 11-13B, redistribution layers (e.g., the first RDL 801 and the second RDL 1101) may be formed on both sides of the first semiconductor die 201 and the second semiconductor die 203. This allows for greater fan-out and greater flexibility in the control and placement of connections as desired, thereby allowing for a greater efficiency in placement and space.

Optionally, after each of the embodiments discussed above with respect to FIGS. 1-13D, the embodiments may further include a singlulation process (not individually illustrated), whereby a first package containing, e.g., the first semiconductor die 201 and the fourth semiconductor die 903 may be separated from a second package containing, e.g., the second semiconductor die 203 and the third semiconductor die 901. The singulation process may be performed by slicing a scribe region between the first package and the second package with, e.g., a diamond coated saw blade, although any suitable alternative method of separation, such as a series of one or more etches to separate the first package from the second package, may alternatively be utilized.

In accordance with an embodiment, a method for forming a device comprising placing one or more bottom dies on a first carrier wafer and forming a first molding compound between the one or more bottom dies such that electrical contacts on the one or more bottom dies are exposed is provided. The one or more bottom dies and the first molding compound are attached to a second carrier wafer, and the one or more bottom dies are thinned to expose through vias formed through the one or more bottom dies. Electrical contacts to the through vias are formed along a backside of the one or more bottom dies, and one or more top dies are attached to the one or more bottom dies.

In accordance with another embodiment, a method of manufacturing a semiconductor device comprising attaching a first semiconductor die to a carrier, the first semiconductor die comprising first external contacts and attaching a second semiconductor die to the carrier, the second semiconductor die comprising second external contacts, is provided. The first semiconductor die and the second semiconductor die are encapsulated with an encapsulant, and a portion of the encapsulant is removed to expose the first external contacts and the second external contacts. The first semiconductor die and the second semiconductor die are thinned to form first through substrate vias in the first semiconductor die and second through substrate vias in the second semiconductor die. A third semiconductor die is electrically connected to the first through substrate vias and a fourth semiconductor die is electrically connected to the second through substrate vias.

In accordance with yet another embodiment, a semiconductor device comprising a first semiconductor die encapsulated by a first encapsulant is provided. At least one through substrate via extends through at least a portion of the first semiconductor die and being exposed on a first side of the first semiconductor die, and first external connectors are located on a second side of the first semiconductor die. A third semiconductor die is in electrical connection with the at least one through substrate via, the third semiconductor die extending over the encapsulant.

Although the present disclosure and its advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a first semiconductor die encapsulated by a first encapsulant;
   at least one through substrate via extending through at least a portion of the first semiconductor die and being exposed on a first side of the first semiconductor die;
   first external connectors located on a second side of the first semiconductor die, the first external connectors being planar with the first encapsulant;
   a first redistribution layer in electrical connection with the first external connectors, the first redistribution layer extending over the first encapsulant; and
   a second semiconductor die in electrical connection with the at least one through substrate via, the second semiconductor die extending over the first encapsulant, wherein the second semiconductor die and the first redistribution layer are located on a same side of the first encapsulant, wherein the second semiconductor die is offset from the first semiconductor die.

2. The semiconductor device of claim 1, further comprising:
   a third semiconductor die encapsulated by the first encapsulant; and
   a fourth semiconductor die in electrical connection with the third semiconductor die, the fourth semiconductor die extending over the first encapsulant.

3. The semiconductor device of claim 2, wherein the second semiconductor die and the fourth semiconductor die are encapsulated by a second encapsulant.

4. The semiconductor device of claim 1, further comprising a second redistribution layer in electrical connection with the at least one through substrate via, the second redistribution layer extending over the first encapsulant.

5. The semiconductor device of claim 1, wherein the offset is between about 100 um and about 3 mm.

6. The semiconductor device of claim 5, wherein the offset is between about 100 um and about 1.5 mm.

7. The semiconductor device of claim 1, wherein the second semiconductor die has a width of between about 3 mm and about 14 mm.

8. A semiconductor device comprising:
   two or more bottom dies;
   a first molding compound between the two or more bottom dies, the first molding compound in physical contact with first electrical contacts on the two or more bottom dies and wherein the first electrical contacts are exposed;
   through vias extending through the two or more bottom dies, the through vias being exposed through the two or more bottom dies on an opposite side of the two or more bottom dies than the exposed first electrical contacts side, wherein a first line extends from the exposed first electrical contacts side to the opposite side and wherein a line perpendicular with the first line intersects with each of the two or more bottom dies and the first molding compound;

second electrical contacts in electrical connection to the through vias along a backside of the two or more bottom dies;

two or more top dies attached to the two or more bottom dies, wherein the two or more top dies are each directly electrically connected to a first redistribution layer; and a first set of external connections, wherein each of the first set of external connections is physically in contact with one of the second electrical contacts, wherein one of the two or more top dies overlies and is offset from one of the two or more bottom dies by between about 100 μm and about 3 mm.

9. The semiconductor device of claim 8, wherein the one of the two or more top dies has a larger width than the one of the two or more bottom dies.

10. The semiconductor device of claim 9, wherein the one of the two or more top dies has a width of between about 3 mm and about 14 mm.

11. The semiconductor device of claim 8, further comprising an encapsulant encapsulating two of the two or more top dies.

12. The semiconductor device of claim 8, wherein the first set of external connections is a solder ball.

13. The semiconductor device of claim 8, further comprising a printed circuit board in physical contact with the first set of external connections.

14. The semiconductor device of claim 8, wherein the offset is between about 100 μm and about 1.5 mm.

15. A semiconductor device comprising:
a first semiconductor die comprising first external contacts, wherein a surface of the first external contacts is at least partially covered by a polymer material, the polymer material having a first sidewall that is planar with a second sidewall of the first semiconductor die;
a second semiconductor die laterally removed from the first semiconductor die, the second semiconductor die comprising second external contacts;
an encapsulant encapsulating the first semiconductor die and the second semiconductor die, the encapsulant being different from the polymer material, wherein the encapsulant is a single material, wherein a first surface of the first external contacts and a second surface of the second external contacts are exposed, wherein the encapsulant, the first external contacts, and the second external contacts are planar with each other along a first surface, the first semiconductor die, the second semiconductor die, and the encapsulant each being on a first side of the first surface;
first through substrate vias in the first semiconductor die and second through substrate vias in the second semiconductor die; and
a third semiconductor die electrically connected to the first through substrate vias and a fourth semiconductor die electrically connected to the second through substrate vias, wherein the third semiconductor die has a first width of between about 1 mm and about 20 mm, the first semiconductor die has a second width of between about 3 mm and about 14 mm, and wherein the second width is less than the first width.

16. The semiconductor device of claim 15, further comprising an external connection in physical contact with one of the first external contacts.

17. The semiconductor device of claim 16, wherein the external connection is a solder ball.

18. The semiconductor device of claim 15, further comprising a redistribution layer between the third semiconductor die and the first semiconductor die.

19. The semiconductor device of claim 18, wherein the redistribution layer is the only redistribution layer adjacent to the encapsulant.

20. The semiconductor device of claim 15, wherein the fourth semiconductor die is wider than the second semiconductor die.

* * * * *